US009812475B2

(12) United States Patent
Baehr et al.

(10) Patent No.: US 9,812,475 B2
(45) Date of Patent: Nov. 7, 2017

(54) DETECTOR ARRANGEMENT AND CORRESPONDING OPERATING METHOD WHEREIN THE DETECTOR IS A SEMI-CONDUCTOR DETECTOR WHICH IS SWITCHABLE BETWEEN COLLECTION STATES WITH SELECTED SUBPIXEL SENSITIVITY

(71) Applicant: Max-Planck-Gesellschaft zur Foerderung der Wissenschaften e.V., Munich (DE)

(72) Inventors: Alexander Baehr, Groebenzell (DE); Rainer Richter, Munich (DE); Florian Schopper, Munich (DE); Johannes Treis, Munich (DE)

(73) Assignee: Max-Planck-Gesellschaft zur Foerderung der Wissenschaften e.V., Munich (DE)

( * ) Notice: Subject to any disclaimer, the term of this patent is extended or adjusted under 35 U.S.C. 154(b) by 240 days.

(21) Appl. No.: 14/706,117

(22) Filed: May 7, 2015

(65) Prior Publication Data
US 2015/0325608 A1 Nov. 12, 2015

(30) Foreign Application Priority Data
May 7, 2014 (DE) .................. 10 2014 006 648

(51) Int. Cl.
*H01L 27/146* (2006.01)
*H04N 5/341* (2011.01)

(52) U.S. Cl.
CPC .. *H01L 27/14609* (2013.01); *H01L 27/14641* (2013.01); *H01L 27/14679* (2013.01); *H04N 5/341* (2013.01)

(58) Field of Classification Search
CPC ......... H01L 27/14609; H01L 27/14679; H01L 27/14641; H01L 27/14612;
(Continued)

(56) References Cited

U.S. PATENT DOCUMENTS

| 4,651,015 A * | 3/1987 | Nishizawa ........ H01L 27/14679 250/208.1 |
| 7,518,203 B2 * | 4/2009 | Lutz .................. H01L 27/14603 257/228 |

(Continued)

FOREIGN PATENT DOCUMENTS

EP 1873834 B1 12/2008

*Primary Examiner* — Que T Le
*Assistant Examiner* — Jennifer Bennett
(74) *Attorney, Agent, or Firm* — Caesar Rivise, PC

(57) ABSTRACT

The invention concerns a detector arrangement for detection of radiation, in particular particle radiation or electromagnetic radiation, with a semi-conductor detector with several pixels for detection of the radiation. It is proposed that the individual pixels each have a first subpixel (1) and a second subpixel (2). The semi-conductor detector can be switched between a first collection state, in which the first subpixel (1) is sensitive and the second subpixel (2) is insensitive so that radiation-generated signal charge carriers are substantially collected only in the first subpixel (1), and a second collection state in which the second subpixel (2) is sensitive and the first subpixel (1) is insensitive so that the radiation-generated signal charge carriers are collected substantially only in the second subpixel (2). The invention furthermore concerns a corresponding operating method and detector arrangements based on the same concept with a higher number of subpixels per pixel.

21 Claims, 11 Drawing Sheets

(58) Field of Classification Search
CPC .. H01L 27/14603; H04N 5/378; H04N 5/347; H04N 5/343; H04N 5/341
USPC ....... 250/208.1, 214 R, 214.1; 257/257, 258, 257/290, 291, 292; 348/302, 308
See application file for complete search history.

(56) References Cited

U.S. PATENT DOCUMENTS

| | | | |
|---|---|---|---|
| 7,564,022 B1* | 7/2009 | Dierickx | H03F 3/08 |
| | | | 250/214 R |
| 2009/0014628 A1* | 1/2009 | Sakano | H01L 27/14609 |
| | | | 250/208.1 |
| 2010/0155806 A1* | 6/2010 | Fourches | H01L 27/14609 |
| | | | 257/315 |

* cited by examiner

DETECTOR ARRANGEMENT AND CORRESPONDING OPERATING METHOD WHEREIN THE DETECTOR IS A SEMI-CONDUCTOR DETECTOR WHICH IS SWITCHABLE BETWEEN COLLECTION STATES WITH SELECTED SUBPIXEL SENSITIVITY

FIELD OF THE INVENTION

The invention concerns a detector arrangement for detection of radiation, in particular particle radiation or electromagnetic radiation. Furthermore the invention concerns a corresponding operating method for such a detector arrangement.

BACKGROUND OF THE INVENTION

Whenever imaging sensors are used for quantitative analysis of incident radiation, precise control of the exposure time, i.e. the time during which the sensor is exposed to the incident radiation, is of essential importance. Either the exposure of the sensor must be as even as possible over its surface, or the inhomogeneities caused by the shutter must be known so precisely that subsequent calibration can be carried out.

In many sectors in which high speeds are not required, mechanical shutters are used. These however do not have arbitrarily short shutter times or arbitrarily high repeat rates, and their life is limited because of the mechanical wear.

Electro-optical shutter elements, such as for example acoustic-optical modulators, indeed have significantly faster time behavior but as attachments with separate control, they are not compact and therefore not suitable for all applications. The same applies to controllable image amplifier tubes.

New developments in the sector of imaging sensors however allow integration of the shutter into the sensor itself in the form of an "electronic" shutter: the radiation is no longer physically isolated from the sensor surface, but the signal is either recorded or rejected at the sensor itself.

Such an electronic shutter circuit cannot however be used for every type of imaging sensor. For CCD-based (CCD=Charge-Coupled Device) sensors for example, such a mechanism cannot be used. Local intermediate stores help but these only have finite storage capacity and also impose a loss of sensitivity.

Concepts on the basis of so-called active pixel sensors (APS) however are widely used. Depending on implementation, such an electronic shutter can be switched with very high cycle rates and very good homogeneity over the sensitive area of the corresponding sensor.

However, all systems currently used for implementing an electronic shutter, using the mechanical or electro-optical concepts specified above, share the common feature that the sensor is completely insensitive outside the opening time of the shutter. The shutter therefore leads to a sensor dead time. This is always a problem for time-continuous measurement, i.e. if images must be recorded in direct succession without dead time and with defined exposure time.

A shutter mechanism may however assume a further function beyond control of the exposure time. It can be used to prevent any signals which are received during the read process from disrupting the signal evaluation and falsifying the signals.

The signal detected by the actual sensor during the exposure time must be extracted from the sensor for processing, then amplified and digitized. Depending on the required precision, correspondingly longer processing times are required. If new signals are received during processing of the signals already present, the signal amplitude is falsified. The nature and extent of the falsification to be expected greatly depend on the sensor used.

For CCDs for example, the working cycle is divided into exposure time and transfer time. During the exposure time, charges generated by incident photons are integrated. During the transfer time, the signal charge is transferred to the read amplifier and amplified there. For time-critical applications, the CCD is read in parallel columns, i.e. each CCD column has its own amplifier channel, whereby the read-out speed can be multiplied approximately by the number of columns. Despite this, additional signals reaching the sensor during the charge transfer are not assigned correctly either in time or in position. These are so-called out-of-time events (OOT).

The abovementioned long signal processing times mean that the total read time is determined not only by the pure charge transfer, but quite significantly by the signal processing. Therefore attempts are made to decouple the transfer time from the signal processing time by creating an intermediate store (frame store) by doubling the number of pixels. There is now a sensor region and a frame store region. The signal charge is (quickly) transferred from the sensor region to the frame store region, and from there can be shifted (slowly) to the amplifiers arranged at the matrix end and amplified while another charge is integrated in the sensor region.

This complex measure indeed significantly reduces the number of OOTs but cannot suppress these completely because of the finite transfer time between sensor and frame store region. However in this case too, the integration time cannot be selected freely since the integration time must be at least as long as the read-out time.

Implementation of an electronic shutter in the CCD is not possible for design reasons. An external shutter can completely suppress any OOTs occurring, but again leads to a dead time.

As already stated, in a CCD the necessary transfer of the signal charge—and indeed of the entire collected charge in the sensor region—to the read node can, in the least favorable case, take place over the entire sensor (and frame store) length. This constitutes a substantial disadvantage of the CCD. A true window mode, in the sense of a rapid non-selectable access to the region of interest (ROI), is not therefore possible. This is the great advantage of a 'true' active pixel detector in which the signal charge is collected and amplified at the point of generation. Here there is no transfer of signal charges, and by corresponding connection and control of the pixels (image points), arbitrary regions can be selected and read with high repeat rate. One example for the implantation of this concept is a sensor matrix consisting of DEPFETs (Depleted Field Effect Transistor). Depending on the size of the ROI, the read speed can be multiplied locally relative to the entire matrix. The use of active pixels sensors however has disadvantages. These include, in particular in DEPFETs, erroneous signal detection due to the permanent sensitivity (see below) and the so-called "rolling shutter" effects.

These are provoked by the temporal offset on reading of different lines (and hence their integration time) and—in particular with rapidly moving objects—can lead to artefacts and image distortion.

Since the amplifying electronics integrated in the pixel lie within the sensor region, signal charges received during processing have a different effect than in the CCD. As described, in the CCD such events are incorrectly assigned in place and time. In the DEPFET, the charge carriers received at an arbitrary time during the read cycle are incorrectly weighted and thus falsify the detected signal amplitude. The DEPFET determines the signal by forming the difference between currents in the transistor of the active pixel before (signal current) and after a deletion pulse (reference current).

If the signal charges reach the internal gate of the DEPFET after deletion, the value of the initial current is falsified, which in the extreme case can even lead to paradoxical "negative" signal amplitudes.

Even more problematic for use however are charges which reach the internal gate of the DEPFET before deletion, since these are incompletely amplified. Such events are highly problematical in particular for spectroscopic applications, since the falsified signal amplitudes appear as an irreducible background in the spectrum.

Such signal falsifications are called "misfits" in the jargon. By their nature, they occur above all in temporally uncorrelated radiation, e.g. on astronomic observations or optical imaging, since here the reading of the sensor cannot be synchronized with the incidence of the radiation. The proportion of misfits to total events here corresponds to the ratio between the signaling processing time and the integration time. Applications in which the signal rate is high are therefore disproportionately affected by the problem, since firstly the total number of "misfit" events rises with the signal rate, and secondly the high signal rate requires an increase in the image rate, i.e. a shortening of the integration time, with otherwise unchanged signal processing time.

Accelerating the read-out by parallelization, e.g. by reading several lines of a matrix simultaneously, also aggravates the problem since the proportion of misfits increases further in proportion to the number of pixels read simultaneously. The extreme case, sensible from the viewpoint of an experimenter, of a hybrid DEPFET pixel sensor read fully in parallel is therefore the least favorable from the aspect of spectral usability of data.

This problem is caused by the permanent sensitivity of the pixel even during the read-out phase. One solution therefore is to switch the pixel insensitive during reading. The concept of the DEPFET allows integration of a conventional electronic shutter. EP 1 873 834 B1 for example proposes a DEPFET structure in which the detector can be switched insensitive during a definable time window, in that the incident electrons are extracted by the deletion contact. An additional electrode surrounding the internal gate of the DEPFET here prevents extraction of the electrons already stored there. This electronic shutter not only opens the possibility of controlling the exposure of the sensor with precision in the microsecond range. In addition, the DEPFET pixel can also be switched during reading to be insensitive to interference signals such as scatter light, thermally generated electrons or even signal electrons which would lead to misfits.

However this option is associated with a dead time of the total sensor which corresponds to the total read-out time. All signal electrons received while the shutter is closed are irrevocably lost. Line by line switching of the shutter indeed reduces the dead time to the read time of a line, but the property of the global shutter is lost as a result.

Some applications, e.g. polarimetry, impose further requirements for the electronic shutter, as well as a purely screening effect. One frequently used technique of polarimetry is based on detection of the so-called Stokes parameter.

Here separate images are recorded while polarization filters are in different positions (typically 4). Since the polarization signal consists of the difference between images from two filter positions, the unpolarized proportion of the light disappears insofar as it does not change while the two images are being recorded. Often however the light is unavoidably disrupted on the path between source and detector. In astronomical observations, it is falsified by turbulence in the upper atmosphere layer. For polarimetry for example, in particular fluctuations in the unpolarized part with frequencies about or above the read-out rate are problematical since the unpolarized part is greater by many orders of magnitude than the polarized part. To suppress the effect of such fluctuations, the polarization plane should be changed and the respective associated image recorded at time intervals as short as possible.

For these studies, usually CCD-based sensors are used. Some instruments use frame-store CCDs which are operated with as high an image rate as possible. For each setting of the polarizer, a separate image is recorded by the CCD. The disadvantage of frame-store CCDs is that the polarization cannot be changed more quickly than the read-out rate of the CCDs. Also OOT-induced errors during shifting into the frame store must be corrected iteratively. Alternatively, special CCDs are used in which lines (typically 4) are covered strip by strip, wherein the lines collect the images of the individual polarizer settings (usually 4). Each polarizer setting is here assigned to a line and the signals of several cycles are cumulated in the respective line before the frame is read. The disadvantage of CCDs with covered columns is that a significant part of the quantum efficiency is lost, and during read-out the same errors occur as for frame-store CCDs as long as the CCD is not shaded otherwise (e.g. mechanically). Also both methods are associated with significant dead time and the maximum image rate remains coupled to the read-out speed.

The disadvantages of known detector arrangements therefore comprise the dead times in which the incident radiation is not detected, or alternatively the artefacts generated in the signal by the permanent sensitivity.

OBJECT OF THE INVENTION

The object of the invention is to create a detector arrangement with an electronic shutter which minimizes the dead times in image detection. Also part images can be detected, i.e. signal electrons can be collected in different time periods in individually assigned stores within an image cell. For the case of periodically recurrent observation conditions, a cumulation of the signals detected directly in the respective store is possible.

SUMMARY OF THE INVENTION

This object is achieved by a detector arrangement and a corresponding operating method according to the invention.

The essence of the invention is that in each of the pixels of a semi-conductor detector, at least two subpixels are present, each of which can be switched alternately sensitive or insensitive, wherein the signal charge is collected in the sensitive-switched subpixel while a charge collection in the insensitive subpixel is prevented by potential barriers. In a first collection state, the first subpixel is sensitive while the second subpixel is insensitive. In a second collection state however, the second subpixel is sensitive while the first subpixel is insensitive.

It should be stated here that with regard to the number of subpixels per pixel, the invention is not restricted to two subpixels per pixel. For example, each pixel may have four subpixels or a different number of subpixels.

The individual pixels therefore in all cases have a dead time in which no radiation is measured on deletion of the collected signal charge carriers. Otherwise the pixels are free from dead time since one subpixel is always sensitive.

Preferably each subpixel comprises a DEPFET as a read element, but the invention is not restricted to DEPFETs with regard to read elements. With a DEPFET as a read element in the subpixels, in the insensitive state potential barriers prevent radiation-generated signal charge carriers from reaching the internal gate of the insensitive-switched subpixel. The potential barriers therefore ensure that radiation-generated signal charge carriers almost exclusively, with a high selectivity, reach the internal gate of the DEPFET in the sensitive-switched subpixel, while the internal gate of the DEPFET in the insensitive-switched subpixel is shielded by the potential barriers.

The DEPFETs of the individual subpixels can preferably be switched between a read mode and a non-read mode, wherein the signal charge carriers collected in the internal gate in read mode generate an output signal which indicates the measured radiation, whereas in non-read mode no signal is read.

The potential barriers for shielding the insensitive-switched subpixel start from shielding electrodes within the area of the insensitive subpixel and extend in the direction of the source region of the insensitive DEPFET, so that the internal gate of the insensitive DEPFET is shielded from signal electrons. At the same time, the potential barriers also prevent the loss of charge already collected from the internal gate of the insensitive DEPFET.

In a variant of the invention, the DEPFETs of the subpixels within a pixel have a common source, wherein the drains of the DEPFETs can then form the shielding electrode.

In another variant of the invention, the DEPFETs of the subpixels in contrast have a common drain within a pixel, wherein the sources of the DEPFETs can then form the shielding electrodes.

A further variant of the invention however provides separate shielding electrodes which are separated from the drains and sources of the DEPFETs and can be controlled separately.

Furthermore, in the context of the invention it is possible for the shielding electrodes of several pixels to be connected together electrically.

It has already been mentioned above that the radiation-generated signal charge carriers, with high selectivity, only reach the internal gate of the DEPFET of the sensitive-switched subpixel, while the internal gate of the DEPFET in the insensitive-switched subpixel is shielded by potential barriers from the radiation-generated signal charge carriers. The potential barriers for shielding of the internal gate of the DEPFET in the insensitive-switched subpixel are produced firstly by shielding electrodes, as has already been briefly explained above. Secondly, these potential barriers can also be produced in that the external gates of the DEPFETs in the sensitive-switched subpixel on one side and in the insensitive-switched subpixel on the other are controlled differently.

The selectivity in the charge collection already mentioned is defined as the ratio between the charge collected by the sensitive subpixel to the charge collected by the insensitive subpixel of a pixel. A selectivity of 1000 therefore means that for 1001 radiation-generated signal charge carriers, 1000 of the radiation-generated signal charge carriers are collected by the sensitive-switched subpixel while only one single radiation-generated signal charge carrier is collected in the insensitive-switched subpixel. The invention advantageously allows a high selectivity of more than 1000.

Simulations have shown that a high selectivity can be achieved in charge collection if the surface area proportion of shielding electrodes to the total pixel surface area is relatively high. Preferably the surface area proportion of the shielding electrodes to the total pixel surface area is therefore at least 10%, 20% or even at least 30%.

Furthermore, simulations have shown that a high selectivity can be achieved in the charge collection if the distance between the internal gates (for a common source therefore the lateral extension of the common source region), and also the gate lengths of the DEPFETs, are short. With the detector arrangement according to the invention, the lateral distance between the internal gates of the DEPFETs in the subpixels of a pixel is therefore preferably substantially smaller than the lateral extension of the shielding electrodes.

Furthermore, a high potential difference between the two shielding electrodes naturally also causes a higher selectivity.

One advantageous embodiment of the invention lies in that the signal of the insensitive-switched DEPFET can be read without the reading being falsified by charges received during this period and without a substantial deterioration in the charge collection of the sensitive-switched pixel.

As has already been mentioned briefly above, with regard to the number of subpixels per pixel, the invention is not restricted to two subpixels per pixel. For example the invention may also comprise a variant with four subpixels per pixel, wherein the subpixels are switched sensitive sequentially and are otherwise insensitive. Here each subpixel preferably has its own DEPFET as a read element. The subpixels may here be arranged on a common substrate and be separated from each other by a separator (e.g. of polysilicon).

In addition, the detector arrangement according to the invention preferably also comprises a control unit, which in a suitable manner causes the semi-conductor detector to switch the subpixels to be sensitive or insensitive, and to switch between read mode and non-read mode. Firstly, for this the control unit is connected to the shielding electrodes in order to produce the potential barriers for shielding the insensitive pixel. Secondly, the control unit is however also connected to source or drain and to the external gate of the DEPFETs of the individual subpixels.

For switching between the different collection states, it is noted that all DEPFETs of the detector arrangement in the first collection state can be switched simultaneously to the second collection state. In addition all DEPFETs of the detector arrangement in the second collection state can simultaneously be switched to the first collection state.

Furthermore the individual pixels each have a drift structure which allows the radiation-generated signal charge carriers to drift to the DEPFETs.

Furthermore it is stated that in each pixel, preferably one subpixel (e.g. with a DEPFET as a read element) is always sensitive, so that the individual pixels in all cases have a dead time on deletion of the collected signal charge carrier and are otherwise free from dead time.

In a preferred exemplary embodiment of the invention, the pixels in the detector arrangement are arranged as a matrix in lines and columns. Switching between the different collection states can here take place globally, wherein all pixels of the matrix are switched between the collection states together, or line by line, wherein all pixels of a line are switched between collection states together. Alternatively it is possible for switching between the different collection states to take place by columns, wherein all pixels of a column can be switched between the collection states together. In addition, switching between read mode and non-read mode can take place by lines or columns.

Furthermore, the invention also comprises a corresponding operating method for a semi-conductor detector with several pixels, and in each case at least two subpixels per pixel.

As part of the operating method according to the invention, the subpixels are switched sensitive or insensitive successively, wherein in each case radiation-generated signal charge carriers are collected in the sensitive subpixel while the insensitive-switched subpixel is shielded and collects no radiation-generated signal charge carriers.

The signal charge carriers collected in the subpixels are then read in a read mode.

In a variant of the invention, the subpixels are each read in the insensitive state. The first subpixel is therefore then read in the second collection state in which the first subpixel is insensitive while the second subpixel is sensitive. The second subpixel is here read in the first collection state in which the first subpixel is sensitive while the second subpixel is insensitive.

In another variant of the invention, the subpixels are however each read in the sensitive state. The first subpixel is therefore then read in the first collection state in which the first subpixel is sensitive while the second subpixel is insensitive. The second subpixel is here read in the second collection state in which the first subpixel is insensitive while the second subpixel is sensitive.

In the variant described above of a semi-conductor detector with four subpixels per pixel, the subpixels are preferably switched sensitive and insensitive in succession. Preferably only one subpixel per pixel is sensitive in each case, while the other subpixels of the pixel are insensitive.

Furthermore it is stated that the sensitive state of the individual subpixels is preferably set only very short, for example with a duration of less than 1 ms, 100 µs or even less than 10 µs.

Further advantageous refinements of the invention are described in the subclaims or explained in more detail below with reference to the drawings.

DETAILED DESCRIPTION OF THE DRAWINGS

Figure 1A:
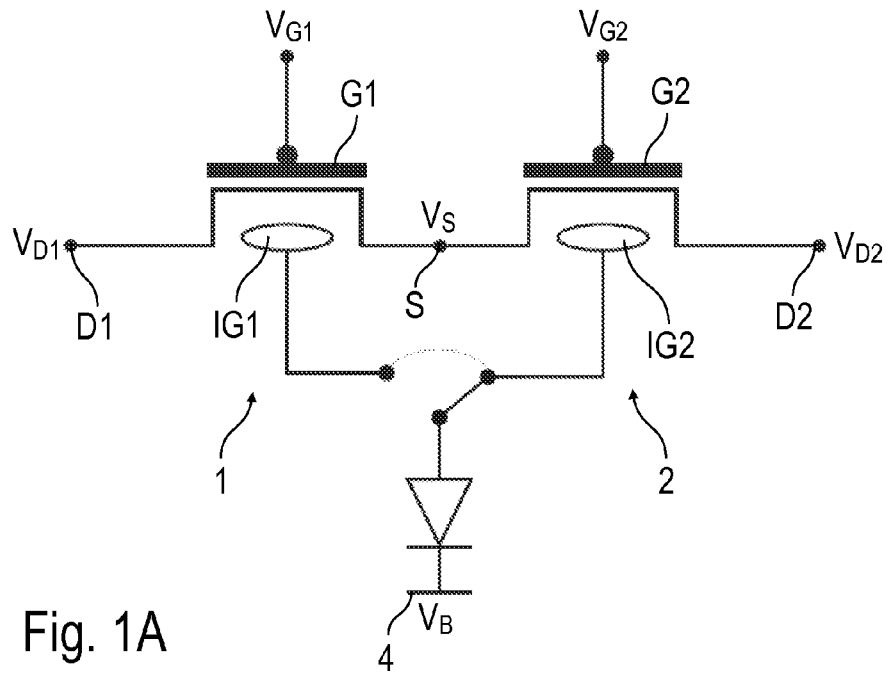
FIG. 1A shows an equivalent circuit diagram of a pixel of a detector arrangement according to the invention, wherein the pixel has two subpixels.
Figure 1B:
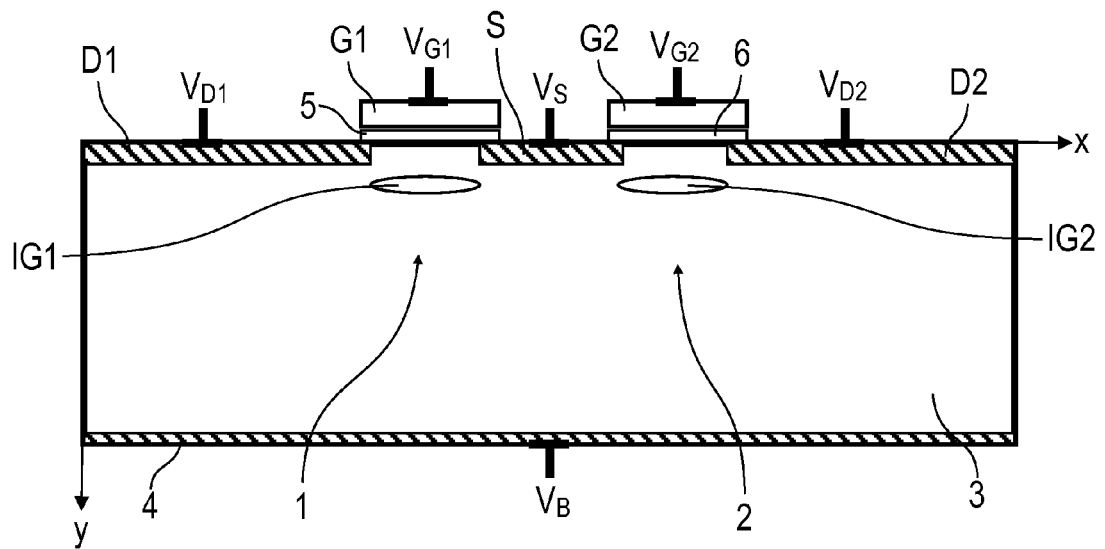
FIG. 1B shows a cross section view through the pixel according to FIG. 1A along section line A-A in FIG. 1D.
Figure 1C:
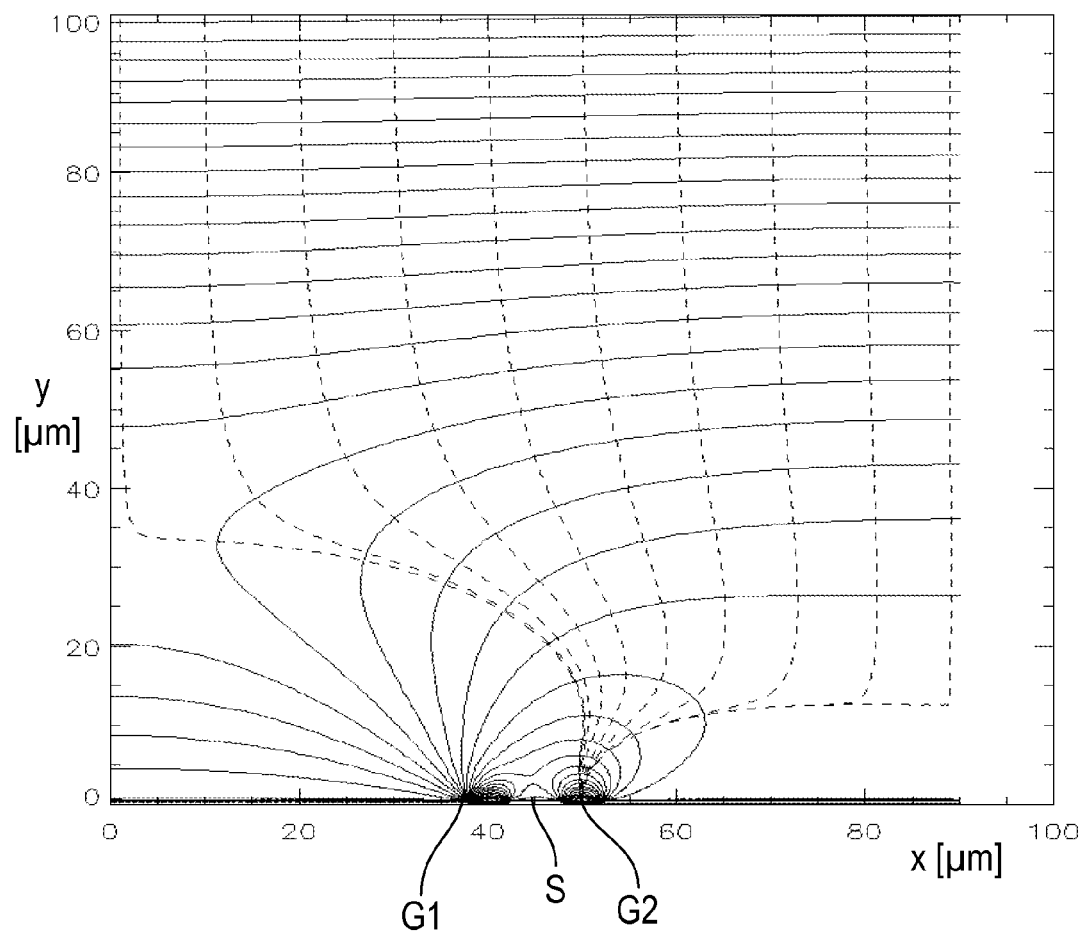
FIG. 1C shows the course of electrical field lines and equipotential lines in the pixel of the detector arrangement according to FIGS. 1A and 1B.
Figure 1D:
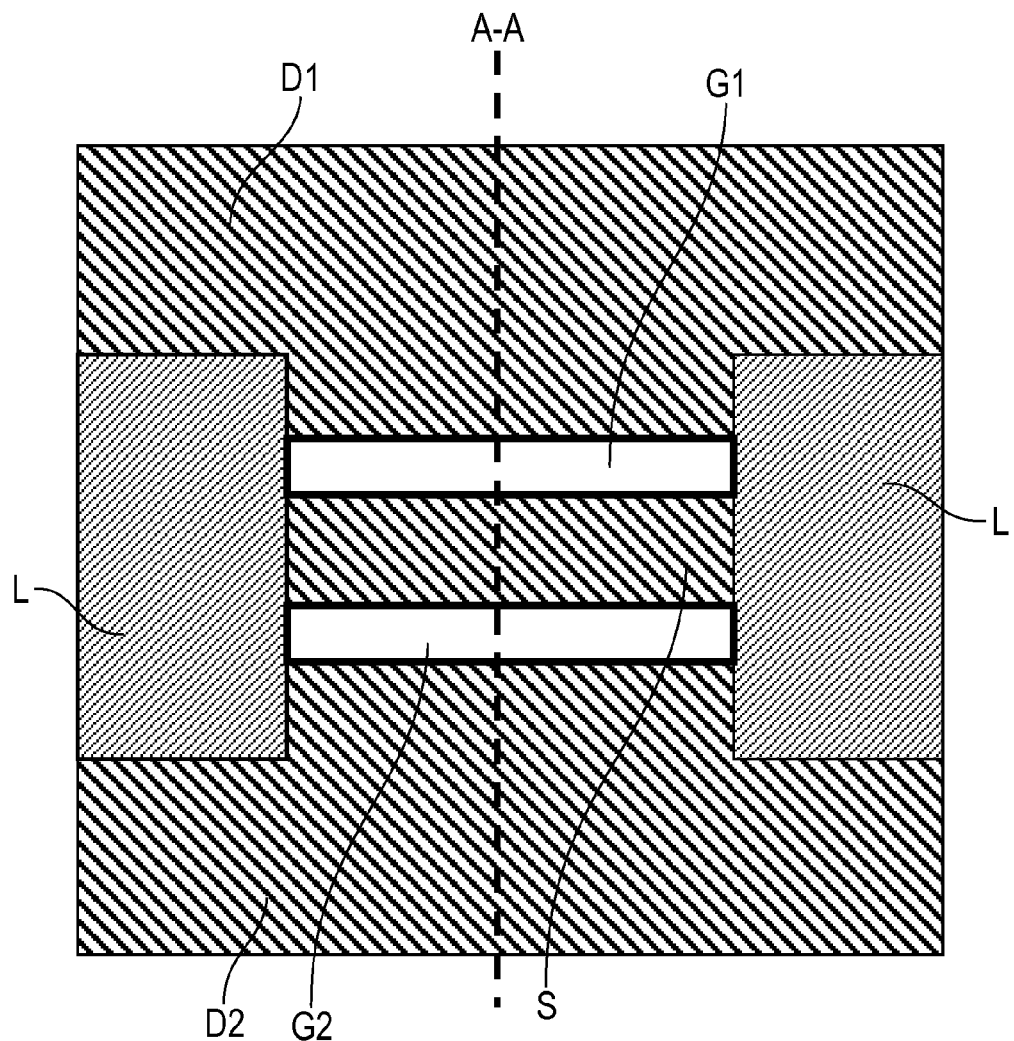
FIG. 1D shows a top view of the pixel according to FIGS. 1A-1C.

In the simplest case, according to FIGS. 1A-1D, a pixel of the detector structure according to the invention consists of two adjacent DEPFETs 1, 2 each with a common source S, each with a drain D1, D2, each with an internal gate IG1, IG2, and each with an external gate G1, G2, wherein the DEPFETs 1, 2 are located on the surface of a weakly n-doped (high-impedance) silicon wafer 3 and each form a subpixel. FIGS. 1B and 1D show a cross section and the associated layout (top view).

The silicon wafer 1, in the region of a sensor matrix consisting of the DEPFETs 1, 2, has on the back a heavily p-doped thin layer 4. The actual DEPFETs 1, 2 are arranged on the top of the silicon wafer. They are formed by external (MOS) gates G1, G1 with dielectric 5, 6. The source region S common to the two DEPFETs 1, 2 and the drains D1, D2 delimit the transistor channels, below which are the internal gates IG1 and IG2. These serve as collection electrodes on collection of the signal charge generated in bulk, and as additional electrodes controlling the channels on read out.

The two DEPFETs 1, 2 together with a deletion structure L (see FIG. 1D) form a pixel with two subpixels. The charge incident in this region is assigned to this pixel. The two DEPFETs 1, 2, in the internal gates IG1, IG2 of which the charge is stored alternately, are designated subpixels in the context of the invention. A sensor usually consists of a matrix-like arrangement of pixels.

Figure 6:
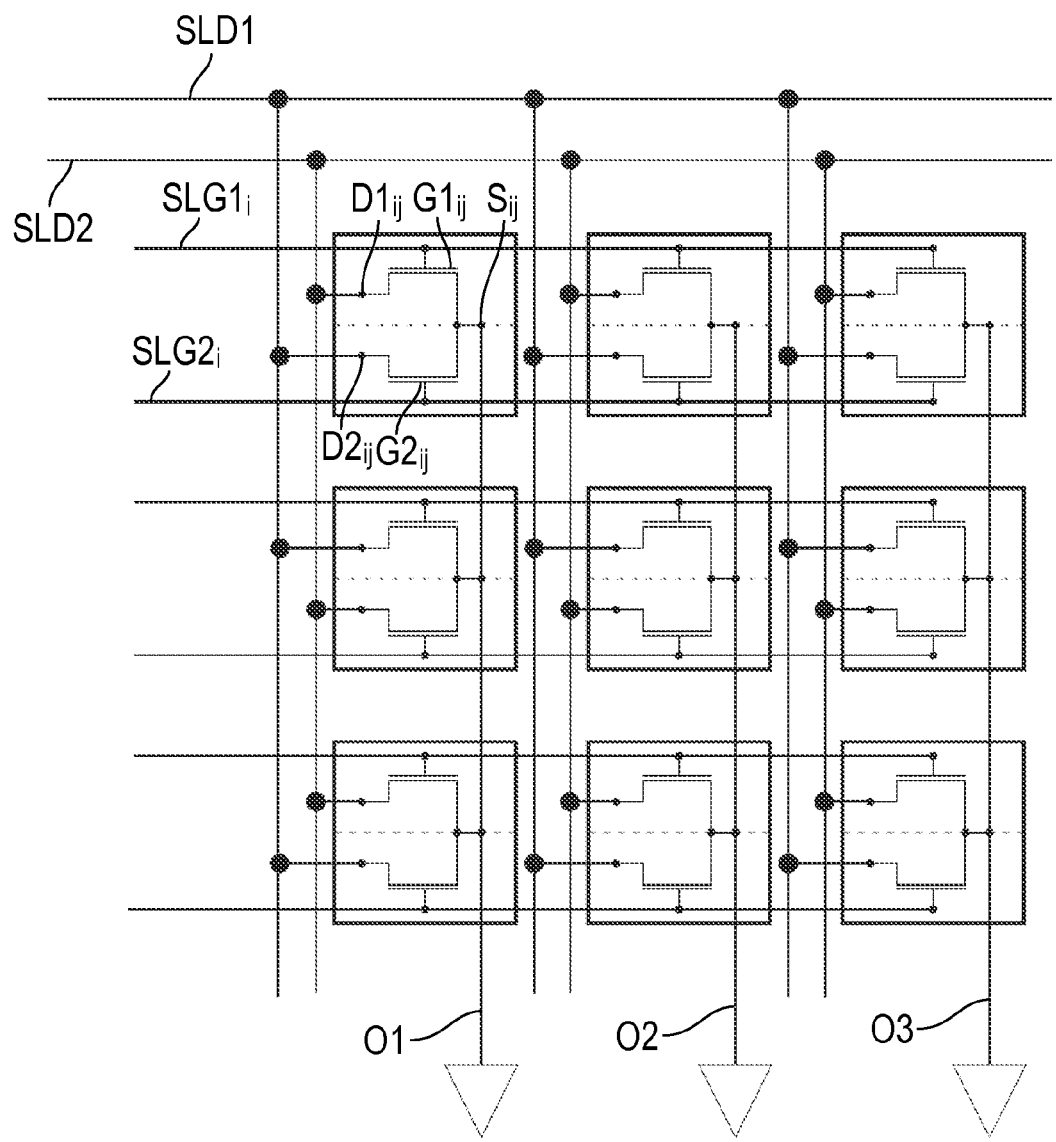
FIG. 6 shows the connection of several pixels, each with two subpixels, in a sensor matrix.

The operation of the pixel according to the invention is described below. In this exemplary embodiment, the focus lies on minimizing dead time during reading of the DEPFET matrices, and the function of the shielding electrodes is assumed by the drains D1, D2 of DEPFETs 1, 2. A connection of the pixels within a matrix according to the exemplary embodiment described below is shown in FIG. 6.

Here control lines SLD1 and SLD2 serve to control the drains $D1_{ij}$ and $D2_{ij}$ of the individual subpixels. Each drain $D1_{ij}$ and $D2_{ij}$ of the individual subpixels is here connected to one of the two control lines SLD1 and SLD2, in the individual columns alternately.

Furthermore each line of the matrix has two control lines $SLG1_i$ and $SLG2_i$ which are connected to gates $G1_{ij}$ and $G2_{ij}$ of all pixels of the respective line.

Finally the common sources $S_{ij}$ of the pixel are each connected within a column to an output line O1, O2 or O3 per column.

Charge Collection and Charge Storage

During all operating phases, the silicon wafer 1 is depleted. The depletion (charge carrier depletion) results from a relatively high negative voltage $V_B$ applied to the rear layer 4 in interaction with the depletion effect of the p⁺-doped drains D1, D2 and the also p⁺-doped source S and the deletion process.

On collection of the signal charge, the two subpixels are switched off i.e. the external gates G1, G2 are set to the relatively positive potential $V_{G1}$ or $V_{G2}$ compared with a reference potential $V_S$ of source S. For the sake of simplicity, the threshold voltages of the DEPFETs 1, 2 with empty internal gates IG1, IG2 lie at 0V, so that the DEPFETs 1, 2 are blocking. It is characteristic of the invention that the drains D1, D2 of the two subpixels which also serve as shielding electrodes lie at different potentials. The one drain D1, as normal with p-channel transistors, lies at a negative potential ($V_{D1}=-5V$). The other drain D2 is switched to a potential which is positive relative to this ($V_{D2}=0V$).

FIG. 1C shows the resulting, simulated two-dimensional potential development within a pixel structured according to FIGS. 1B and 1D, in section A-A. Since the simulations relate to a right-hand coordinate system, the surface of the silicon wafer 3 with DEPFETs 1, 2 lies at coordinate y=0, and the back with the p$^+$-doped layer 4 lies at y=450 µm. The potential distribution within the first 100 µm is shown. The continuous lines are lines of equal potential (isopotential lines). The dotted electric field lines run perpendicular to these. They form the trajectories for the signal electrodes and were selected so that they sweep over the semi-conductor below the pixel. They all end in the internal gate IG2 of the right subpixel, the drain D2 of which lies at 0V, even when the trajectories start below the left subpixel. The internal gate IG1 of the left subpixel does not collect any charge.

As already stated, in this exemplary embodiment the drains D1, D2 function as shielding electrodes. They repel the charge from the left subpixel and conduct it to the right subpixel. It is an essential part of the invention that the roles of the two pixels are exchanged. For this it is only necessary to switch the voltage values present at the shielding electrodes. Subpixels of which the shielding electrodes lie at a positive potential and which can therefore collect electrons, are referred to below as sensitive. In contrast, subpixels with shielding electrodes lying at negative potential i.e. with shielded internal gates, are insensitive. The advantage of this sensor component will become clear in consideration of the read process.

Reading

As described in the prior art, DEPFET matrices are preferably read line by line in rolling shutter mode. The image stored in the entire matrix is called a frame. In a matrix with n lines, consequently n read out processes are required to obtain a frame. To read a line, the corresponding gate is activated so that the DEPFETs of this line become conductive.

For a current read-out, the signal current, i.e. the transistor current modulated by the charge in the internal gate IG1 or IG2, is detected and temporarily stored by read electronics arranged at the edge of the matrix.

In the alternative voltage read-out (source follower), the active DEPFET 1 or 2 transfers the read line which connects the transistor to the read electronics. The signal voltage value is then detected and temporarily stored.

Then the reference value is determined. For this the charge is removed (deleted) from the internal gate IG1 or IG2 using the deletion structures L (see FIG. 1D). The current or voltage value then measured represents the charge state of the empty internal gate IG1 or IG2. As a measure of the charge previously collected, in the read electronics the difference is formed from the signal and reference value i.e. the values before and after deletion. This known technique is called "correlated double sampling" (CDS).

As already explained, signals which reach the internal gate IG1 or IG2 during reading are not detected correctly because either the signal or the reference value is falsified by the incident charge carriers, which results in erroneous values in the difference formation.

In the pixel according to the invention (in this exemplary embodiment) there is a sensitive and an insensitive subpixel. In the insensitive (left) subpixel, a negative voltage lies at the drain D1, whereby the internal gate IG1 is shielded. At the same time however, the subpixel can be read by activating the associated gate G1. This ensures that during the reading process, no charge can reach the internal gate IG1 and so-called "misfit" events are efficiently suppressed. In contrast to a deletion which is based solely on an electronic shutter, the signal charge received during the read time is not lost but is conducted to the internal gate IG2 of the other subpixel, now sensitive.

In this exemplary embodiment, the voltages are switched globally at the shielding electrodes, in this case drains D1, D2. At all points on the matrix, simultaneously insensitive subpixels become sensitive subpixels and vice versa. The matrix reading (frame reading) can then take place line by line as usual. For this, in each pixel of an activated matrix line, only the insensitive subpixel is read while the sensitive subpixel can continue to collect signals. If necessary, an additional integration time follows the reading process, during which signals are only collected but are not read. In this state all external gates G1 and G2 are switched off.

When reading is complete, before the start of the next read cycle, the roles of the subpixels are exchanged again by global switching of the shielding electrodes (i.e. drains D1, D2). The previously sensitive subpixels now store both the charge collected during the last integration time and the signal charge which was received during the preceding read cycle. The latter image information is also detected unfalsified in the pending read cycle.

In a sensor based on the detector structure according to the invention and operated as described above, no misfits can occur and their suppression is not associated with additional dead time. Real advantages are therefore offered, in particular on repeated detection of ROIs with high image rate and in reading of sensors with a high degree of parallelization.

The former can indeed be implemented with conventional DEPFETs but, because of the unfavorable ratio of integration to read time, the spectroscopic quality is significantly poorer than for the full frame read-out.

The same also applies for reading sensors with high degree of parallelization. In a "conventional" DEPFET, the proportion of misfits is directly proportional to the number of pixels read simultaneously. The least favorable case therefore corresponds to the fully parallel read-out, i.e. a hybrid pixel sensor in which all pixels are read simultaneously. A sensor based on the detector structure according to the invention however supplies usable data with simultaneously good spectroscopic quality even for a maximum degree of parallelization.

In addition, the design described of such a sensor according to the invention has a further advantage. Because of the simultaneous global switching, image detection is instantaneous, whereby no artefacts can occur due to "rolling shutter" effects. These have a disruptive effect in the optical sense in particular on imaging of rapidly changing objects.

The switching of the shielding electrodes (i.e. drains D1, D2) can take place very quickly. Indeed all control lines leading to the shielding electrodes must be switched simultaneously, which leads to a high capacitive load, but for this special driver chips can be used, of which only two are needed per matrix. This situation is comparable with the global switching of registers in a CCD, for which normally significantly less than 100 ns are necessary. However the switching of the subpixels need only take place once per read cycle, whereas for a three-phase CCD, three cycles per line read are required. Thus the loss power balance is substantially more favorable for the DEPFET matrix. Naturally it is possible that the signal charge which reaches the pixel during the short switching process is split over two subpixels. This charge is not however lost. If necessary it can be correctly reconstructed on subsequent analysis of the data.

The two subpixels are reset via common deletion structures L which connect to the internal gates IG1, IG2 on the left and right (see FIG. 1D). This is a very compact layout, in particular because the number of control lines and the number of driver chips for the deletion process are halved. However it is assumed that the insensitive subpixels can retain their charge during the deletion process, which is guaranteed by a sufficiently positive potential of the internal gates of these subpixels. For technological reasons however it is possible that this positive potential cannot be set, e.g. because the associated electrical fields trigger charge carrier multiplications in the region of the internal gate. Then the more complex arrangement should be selected, in which each subpixel has its independently controllable deletion structure.

Figure 2A:
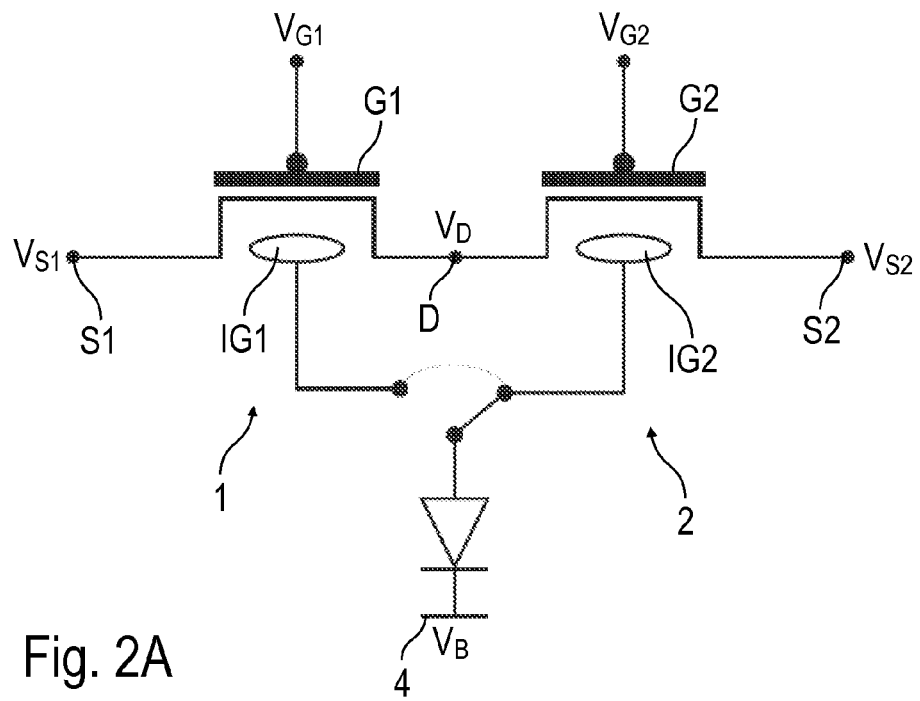
FIG. 2A shows an adaptation of FIG. 1A.
Figure 2B:
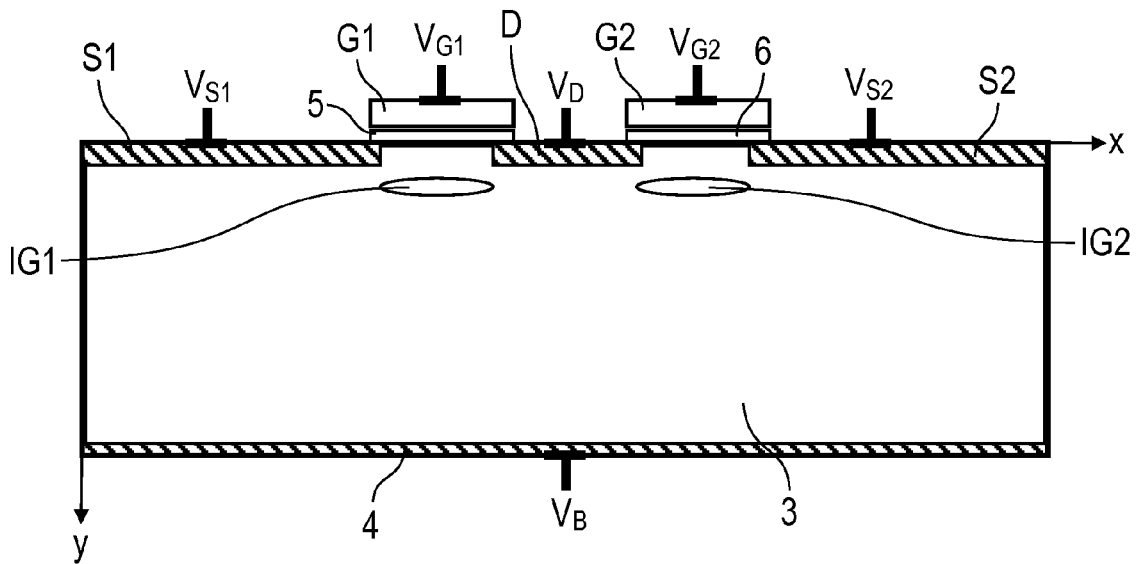
FIG. 2B shows a corresponding adaptation of FIG. 1B.

FIGS. 2A and 2B show an adaptation of the exemplary embodiment from FIGS. 1A-1D, so to avoid repetition, reference is made to the description above, wherein for the corresponding details the same reference numerals are used.

One feature of this exemplary embodiment is that the two DEPFETs 1, 2 have a common drain D and separate sources S1, S2.

There is therefore a further possibility of improving the selectivity of the charge collection between the sensitive and insensitive subpixels by swapping the roles of drain and source. For this, the two subpixels of the common p$^+$-doped region are not—as in the former exemplary embodiments presented—laid to source voltage but to the negative drain voltage. On reading, the signal is again taken from here. The external sources S1, S2 admittedly continue to function as shielding electrodes and are again switched between a positive (sensitive subpixel) and a negative voltage (insensitive subpixel). The shielding electrodes of the insensitive subpixel can here be switched significantly more negatively than the common drain D. Since in this way the potential difference between the shielding electrodes (i.e. the sources S1, S2) may be greater than the source-drain voltage of the DEPFETs 1, 2, significantly higher values can be achieved for selectivity.

For reading, the shielding electrodes S1, S2 must however assume the function of the source, and for this they must be laid to a positive voltage relative to drain D, e.g. 0V. This corresponds however to the sensitive state i.e. the pixel can only be read in sensitive state.

Thus the advantage of misfit suppression is lost. The advantage of the structure lies in the significantly increased selectivity of charge collection. Furthermore, for this structure, a current-based read-out of signals may be implemented at drain D, which offers advantages relative to the achievable read-out speed with significantly lower cost.

The use of such a detector structure is advantageous above all when the sensor can be read after end of the integration phase, or if a high selectivity is required, while the influence of misfits in the spectrum is negligible.

Figure 3:
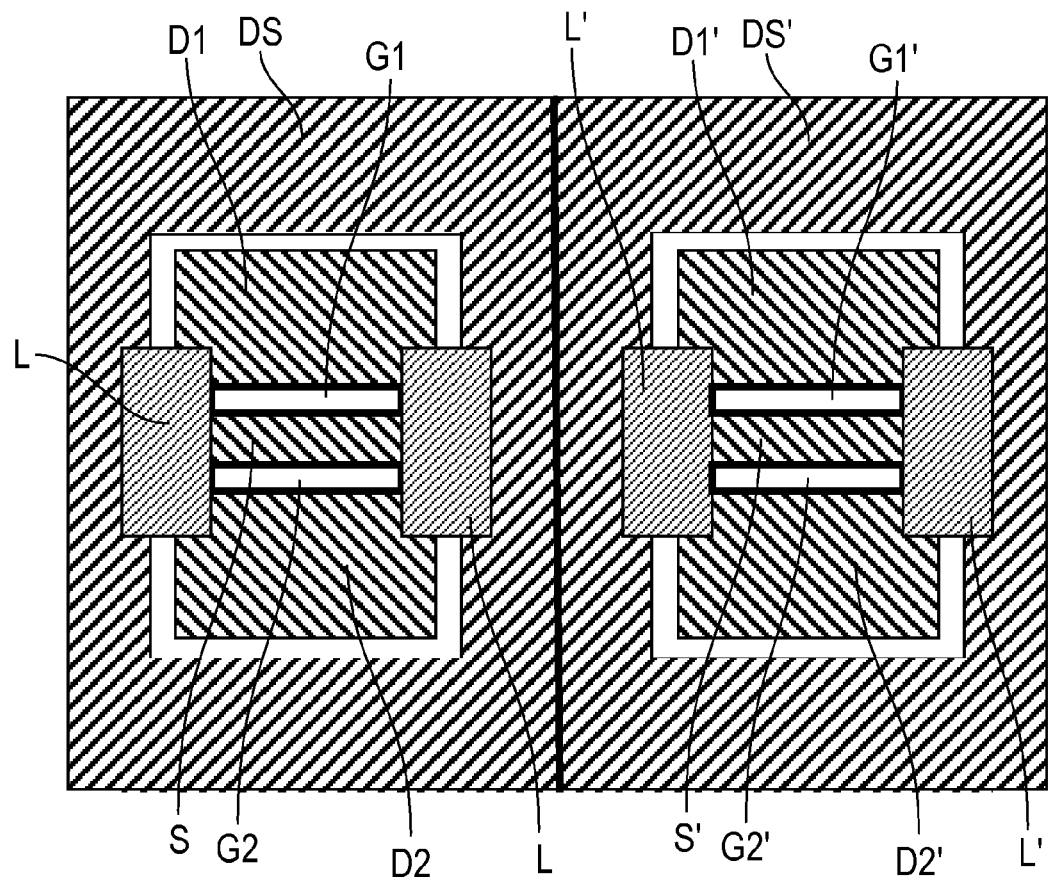
FIG. 3 shows a top view of a detector arrangement according to the invention with two pixels, each having two subpixels, with a drift structure.

The exemplary embodiment according to FIG. 3 also partially correlates with the exemplary embodiments described above, so to avoid repetition, reference is made to the description above, wherein for corresponding details the same reference numerals are used.

Thus FIG. 3 shows the exemplary embedding of two of the pixels described above, each with two subpixels, in a drift structure DS. Evidently other forms of drift structure and also several concentrically arranged, annular drift structures can be used.

Very usefully, drift structures DS can also be implemented by stepped implantations, wherein implantation steps are applied which are used in any case in technological production processes. The spatial charges connected with the implantations can focus the signal charge in the direction of the internal gates IG1 or IG2, or may be used to delimit the pixels.

Figure 7A:
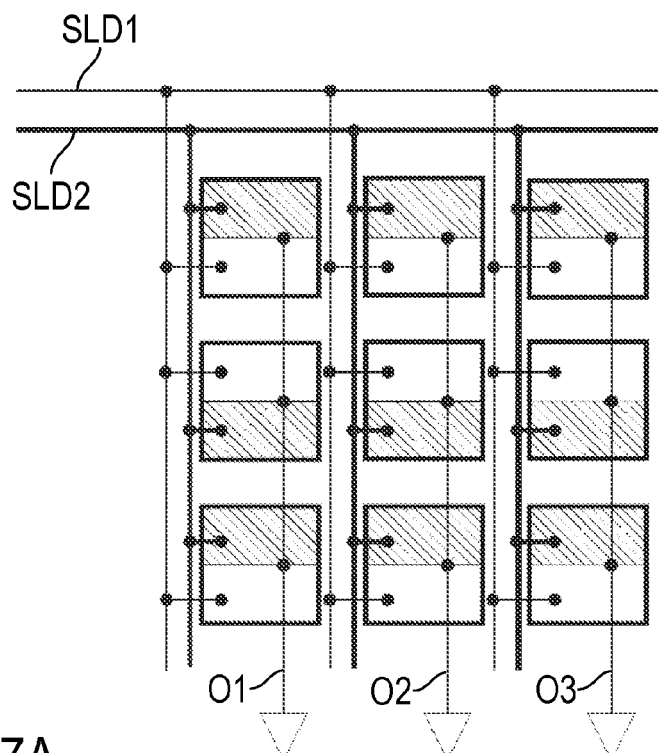
FIGS. 7A and 7B show the sequence of the different collection states for the sensor matrix in FIG. 6.
Figure 7B:
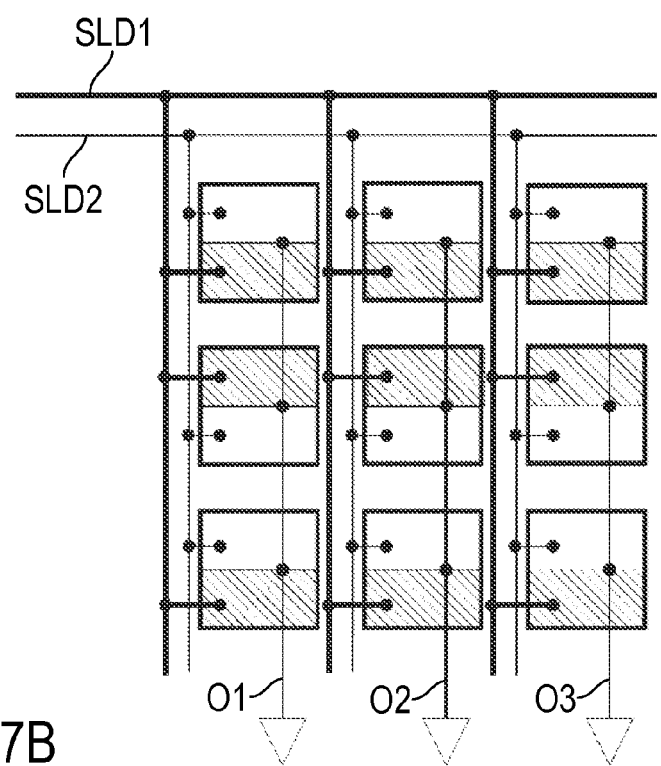

Also, the location and connection of the pixels within the matrix affect the selectivity. With the design shown in FIGS. 1A-1D, a mirror-symmetrical connection relative to the left and right (FIG. 1B), or to the upper and lower pixel limit (FIG. 1D), leads to pixels which are adjacent in the read direction splitting the drain regions D1, D2 functioning as shielding electrodes. This gives a high selectivity because the surface areas of this shielding electrodes are de facto doubled. On reading, it must be taken into account that the pixels border each other alternately with their sensitive and insensitive subpixels. The sequence of control of the different subpixels and their association within the matrix is shown in FIGS. 7A and 7B.

As shown in FIG. 1D, the shielding electrodes are not interrupted towards their lateral neighbors, which leads to an additional increase in surface area. The signal is read at the source S.

The connection of the pixels within a sensor matrix is shown in FIG. 6.

A further, very effective possibility of increasing selectivity lies in lowering the potential of the internal gate IG1 of the insensitive subpixel during collection relative to that of the sensitive internal gate IG2. This can be achieved very easily via the external gate G1. In disconnected state, there is no deletion channel in DEPFET 1 so the external gate G1 can capacitively access the internal gate IG1. This capacitive coupling allows the potential of the internal gate IG1 to be set via the voltage at the external gate G1. For example, the following voltages can be set at the external gate G1, G2:

insensitive pixel in read state: −3V
insensitive pixel in collection state: 1V
sensitive pixel in collection state: 3V.

In the simulation example shown above (FIG. 1C), the selectivity is improved over standard operation (collection state: external gate of insensitive subpixel=3V) by almost an order of magnitude from 9.4e04 to 8.5e05. This improvement is naturally achieved at the cost of a more complex control system. One possible technical solution is to provide a 3-level cycle rate for the control chip for the gate lines.

The read time of a frame, in operation of the matrix in rolling shutter mode, is equal to the sum of the read times required for the individual lines. This limits the time resolution of a detector, which cannot be compensated in all application cases even by the parallel reading of several lines or by the introduction of ROIs. In these cases, the use of pixels according to the invention, due to the suppression of misfits, indeed leads to a significant improvement in the spectroscopic quality of the signals but the problem of the low time resolution is not eliminated.

In the hybrid DEPFET pixel sensor, using 3D integration techniques a separate read amplifier is assigned to each DEPFET pixel. These amplifiers are also arranged as a matrix within a read chip. The read process may therefore be carried out completely in parallel with maximum possible time resolution. As already stated, this is however the least favorable case from the viewpoint of "misfit suppression". The use of the pixel according to the invention as a sensor element is particularly advantageous here. It is suitable to connect the source region common to the two subpixels to the input of the assigned amplifier via a bump bond.

Figure 4:
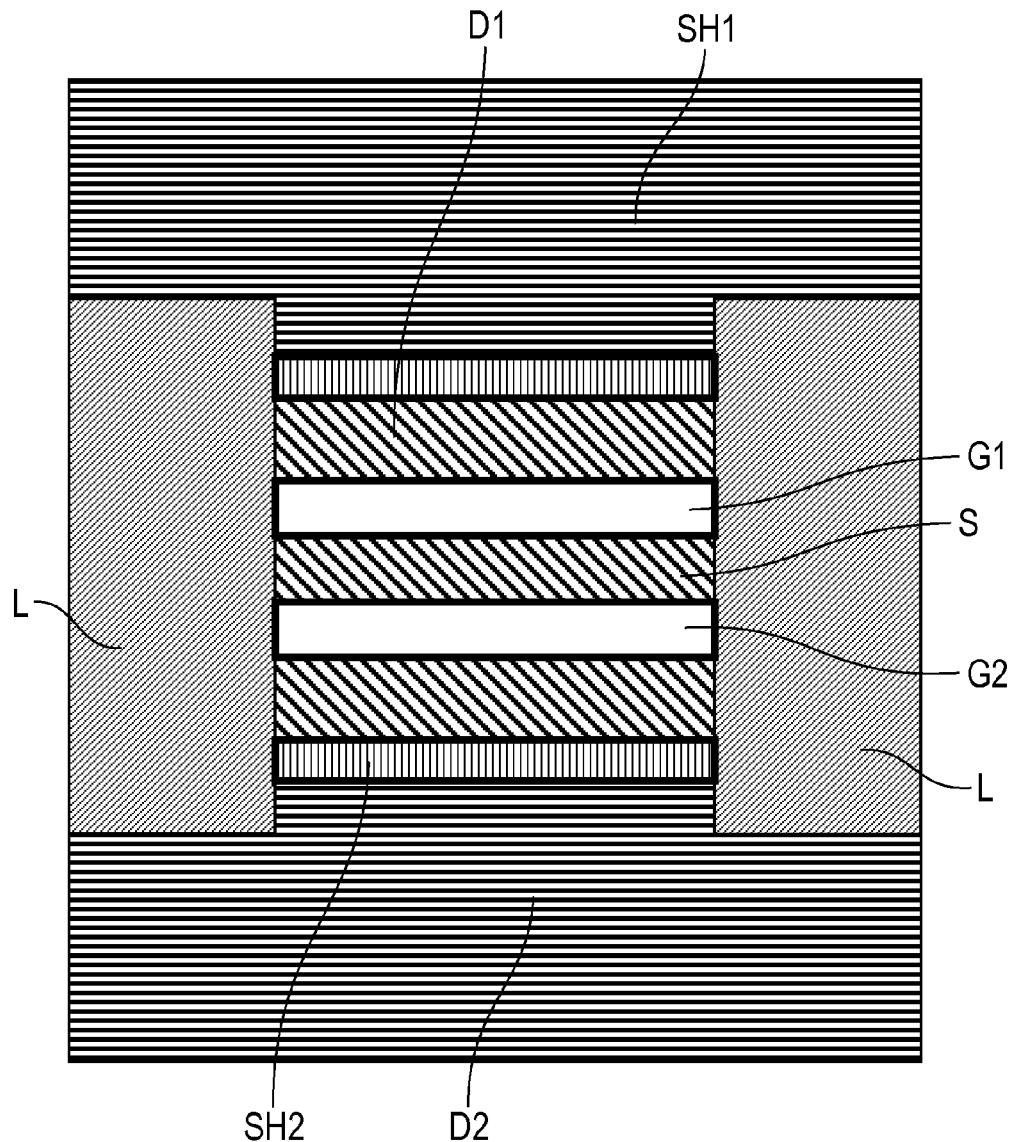
FIG. 4 shows an adaptation of FIG. 1D with additional shielding electrodes separate from the DEPFETs.

The exemplary embodiment in FIG. 4 also partly correlates with the exemplary embodiments described above, so to avoid repetition, reference is made to the description above, wherein for corresponding details the same reference numerals are used.

This exemplary embodiment has separate shielding electrodes SH1, SH2 which are separate from the drains D1, D2. The shielding electrodes SH1, SH2 therefore need not necessarily be formed by the drains D1, D2 of the DEPFETs 1, 2. If the faster current read-out is required in a detector, usually drains D1, D2 are connected to the amplifiers of the electronic read chip. If however sampling takes place over a wider voltage range, precautions must be taken to decouple the amplifier input. This can be avoided if the shielding function is transferred to the separate shielding electrodes SH1, SH2 arranged further out. For this, as shown in FIG. 4, drift structures are suitable. To guarantee an effective potential access to the regions below the internal gates IG1, IG2, the drain regions D1, D2 lying in-between should be relatively narrow. One advantage of this arrangement is that the choice of voltage differences at the shielding electrodes SH1, SH2 may be independent of the transistor function. They may lie in the range of 10V or 20V, whereby the greater distance from the internal gate IG1 or IG2 can be compensated. The more positive shielding electrode voltage for the sensitive-switched subpixel should not however be more positive than the drain voltage, because otherwise potential barriers for the signal electrons would be constructed.

Figure 5:
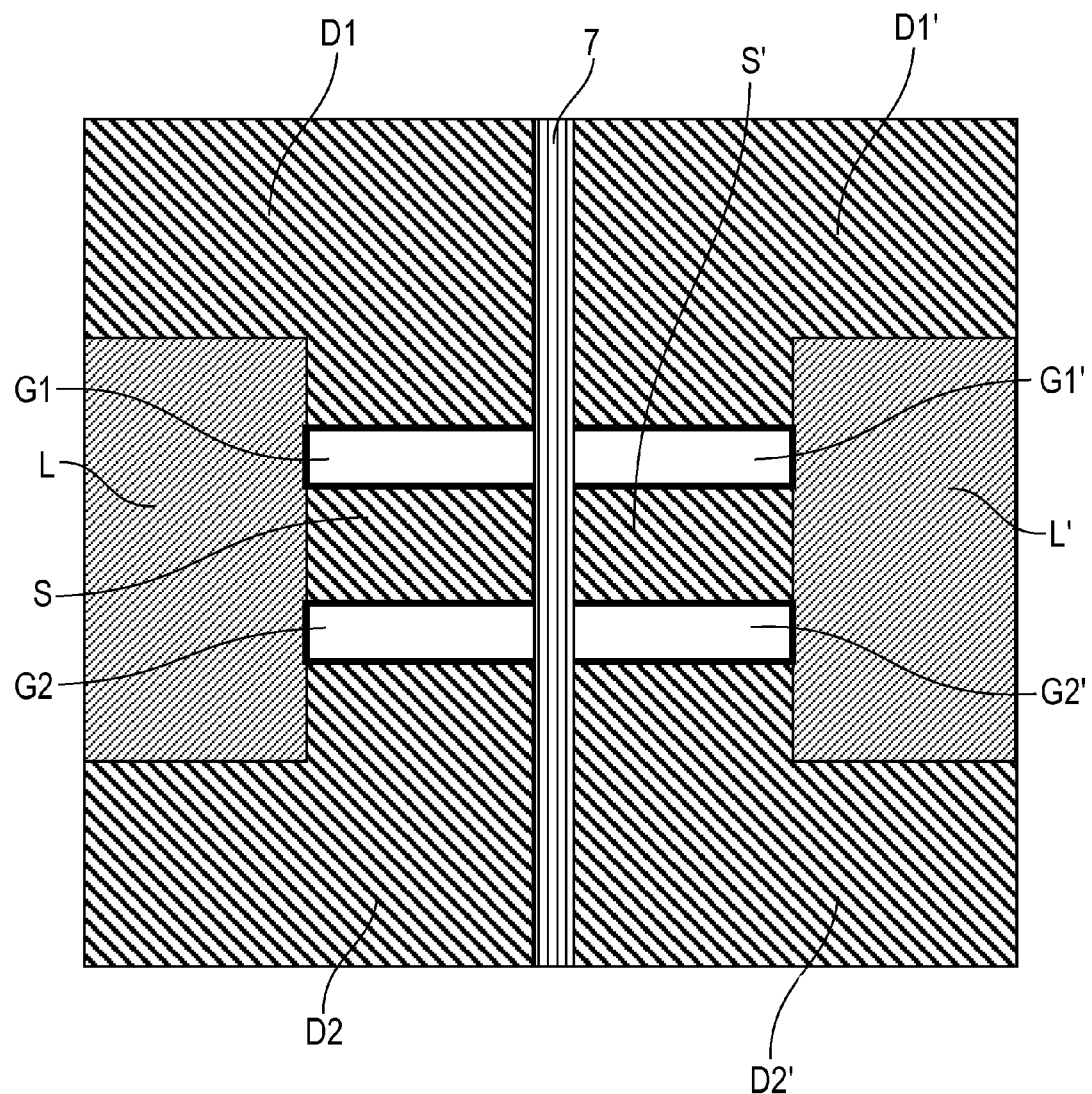
FIG. 5 shows an adaptation of a pixel with four subpixels.

The exemplary embodiment in FIG. 5 also partly correlates with the exemplary embodiments described above, so to avoid repetition, reference is made to the description above, wherein for the corresponding details the same reference numerals are used.

It should be stated here that the switching of the shielding electrodes can take place more frequently than the reading of the image information. Since this takes place very quickly and with no loss of signal charge, signal charges can therefore be assigned to m different temporal phases of the image detection. Here m is the number of subpixels of a pixel. The switching of the shielding electrodes here takes place simultaneously for the entire matrix. A typical application for imaging polarimetry would use 4 subpixels, as shown in FIG. 5.

In contrast to the arrangement shown in FIGS. 1A-1D, the two subpixels are separated by a separator 7 which is preferably formed by a first polysilicon layer. The external gates G1, G2 of the DEPFETs are formed from a second polysilicon layer deposited later. In production, the first polysilicon layer of the separator 7 blocks off the implantations which form the channels and the internal gates, so that these are separated and internal gates are formed within a pixel. The separator 7 also splits the $p^+$-implanted shielding electrodes (drains) and the $p^+$-implanted source region, whereby finally four subpixels result, each with a shielding electrode.

The separator 7 is laid to a slightly positive voltage of approx. 1V in order to suppress parasitic channels between the $p^+$-doped regions. On use of an additional n implantation in the silicon covered by the separator 7, this voltage shifts to more negative values.

For this in a polarimeter, in synchrony with the switching of the modulator, in each case precisely one of the four shielding electrodes is switched to collection mode (0V) while all others repel the charge (shielding electrodes at −5V). If, for example during the first polarizer setting, the signal charge is collected in the first subpixel, simultaneously with switching of the polarizer via the second shielding electrode, the second subpixel is switched sensitive and the first insensitive via its shielding electrode. The process is the same for the third and fourth polarizer settings. When the first polarizer setting comes round again, the signal charge is added to the signal electrons already present in the first subpixel. This cycle is continued until sufficient photons have been collected or the dynamic range of the DEPFET is exhausted. If the modulator has four positions, four separate DEPFET stores are required per pixel in order to store the image intensities of the four modulator settings. With this method, the four subpixels are filled with signal charges in close temporal correlation, so that on later subtraction of the images, higher frequency interference is also deleted.

As in the first exemplary embodiment, here too it is advantageous to improve the selectivity by combining the shielding electrodes of adjacent subpixels beyond the pixel boundaries. If the pixel shown in FIG. 5 is connected mirror-symmetrically in both directions relative to the pixel boundaries, we find that the surface areas of the combined shielding electrodes are four times larger than the area of a single subpixel-related shielding electrode. Connection of the pixels in a matrix arrangement is shown in FIGS. 8 and 9A-9D. The enlarged shielding electrodes rotate around the pixel on switching, as illustrated by the image sequence contained in FIGS. 9A-9D.

Here four control lines SLD1, SLD2, SLD3 and SLD4 are shown, wherein in all pixels of the matrix, the drains of the four subpixels are each connected to one of the control lines SLD1, SLD2, SLD3 and SLD4.

Furthermore each line of matrix has two control lines SLG1$i$ and SLG2$i$ in order to control the common gates of each two subpixels of the pixel of the respective line.

Figure 8:
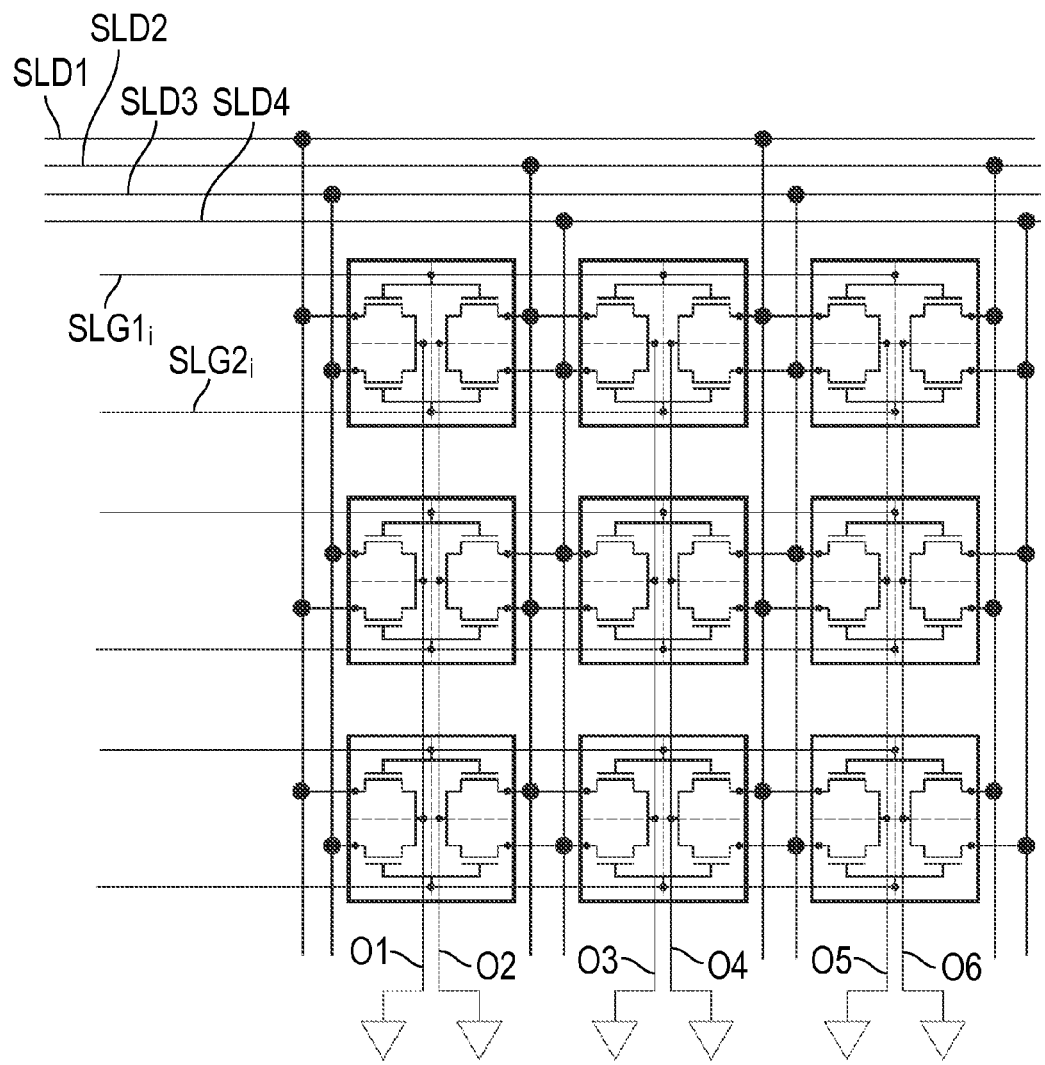
FIG. 8 shows the connection of several pixels, each with four subpixels, in a sensor matrix.
Figure 9A:
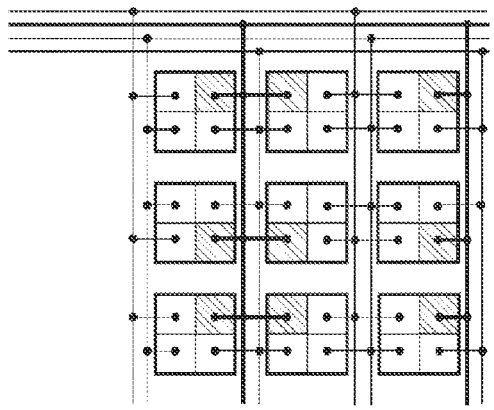
FIGS. 9A-9D show the sequence of the different collection states in the sensor matrix according to FIG. 8.
Figure 9B:
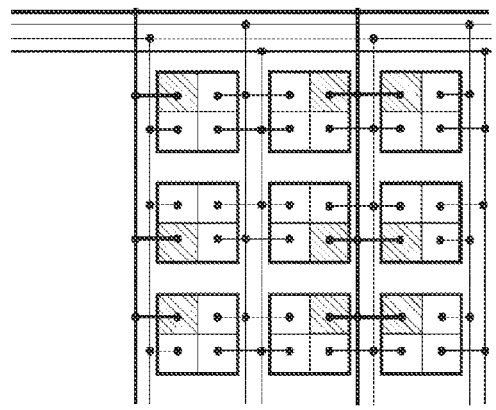
Figure 9C:
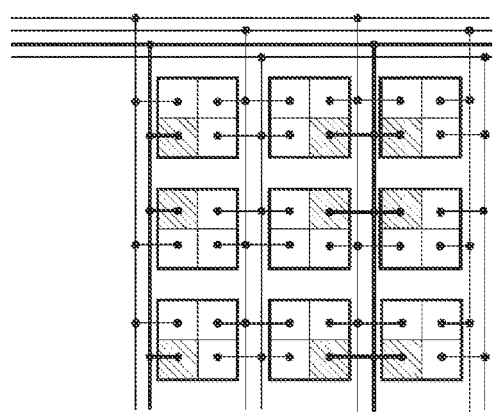
Figure 9D:
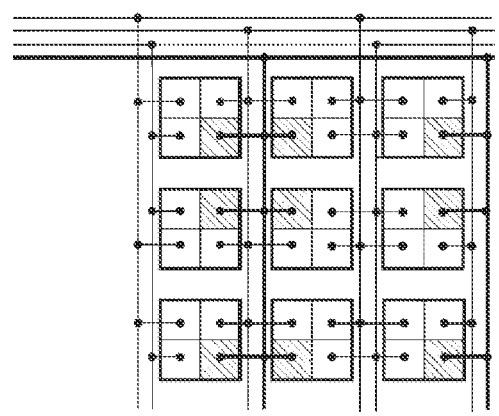

Finally FIG. 8 shows six output lines 01-06 which are each connected in columns to the common sources of the subpixels of the respective column.

Each signal read-out can take place for the subpixels which are already in the insensitive state. During polarizer setting one or two for example, subpixels three and four can be read and vice versa. Reading of a line normally takes substantially less time than collection, for the speed with which the polarizer setting can be changed is decisive for the duration of a collection phase. Usually, the changing of the polarizer plane limits this integration time. Therefore several lines can be read during a polarizer setting.

After a few cycles therefore the entire matrix is read without interrupting the charge collection of the other DEPFETs. In this way a dead time of the system can be avoided.

The invention is not restricted to the preferred exemplary embodiments described above. Rather a plurality of variants and adaptations are possible which also make use of the inventive concept and therefore fall within the scope of the protection.

LIST OF REFERENCE NUMERALS

1 DEPFET
2 DEPFET
3 Silicon wafer
4 Back layer of silicon wafer

5 Dielectric
6 Dielectric
7 Separator
D Drain
D1, D1' Drain
D2, D2' Drain
DS Drift structure
G1, G1' External gate
G2, G2' External gate
IG1 Internal gate
IG2 Internal gate
L, L' Deletion structure
S, S' Source
S1 Source
S2 Source
SH1 Shielding electrode
SH2 Shielding electrode
SLD1 Control line for drains
SLD2 Control line for drains
SLD3 Control line for drains
SLD4 Control line for drains
SLG1$i$ Control line for gates
SLG2$i$ Control line for gates
O1-O6 Output lines
$V_B$ Voltage at rear layer 4 for depletion of silicon wafer 3
$V_S$ Potential of source
$V_{G1}$ Potential of external gate G1
$V_{G2}$ Potential of external gate G2
$V_S$ Potential of common source S
$V_{S1}$ Potential of source S1
$V_{S2}$ Potential of source S2
$V_D$ Potential of common drain D
$V_{D1}$ Potential of drain D1
$V_{D1}$ Potential of drain D2

The invention claimed is:

1. A detector arrangement for detection of radiation, comprising:
   a) a semi-conductor detector with several pixels for detection of the radiation,
   wherein
   b) each of the pixels each has a first subpixel and a second subpixel,
   c) the semi-conductor detector is switchable between
      c1) a first collection state in which the first subpixel is sensitive and the second subpixel is insensitive, so that radiation-generated signal charge carriers are collected substantially only in the first subpixel, and
      c2) a second collection state in which the second subpixel is sensitive and the first subpixel is insensitive, so that the radiation-generated signal charge carriers are collected substantially only in the second subpixel,
   d) the first subpixel has a first DEPFET with an internal gate for collection of radiation-generated signal charge carriers,
   e) the second subpixel has a second DEPFET with an internal gate for collection of radiation-generated signal charge carriers,
   f) in the first collection state, the radiation-generated signal charge carries substantially only reach the internal gate of the first DEPFET, while the internal gate of the second DEPFET is shielded, so that substantially none of the radiation-generated signal charge carriers reaches the internal gate of the second DEPFET, and
   g) in the second collection state, the radiation-generated signal charge carriers essentially only reach the internal gate of the second DEPFET, while the internal gate of the first DEPFET is shielded, so that essentially none of the radiation-generated signal charge carriers reaches the internal gate of the first DEPFET.

2. The detector arrangement according to claim 1, wherein
   a) the pixels have a dead time in all cases on deletion of collected signal charge carriers and are otherwise free from dead time, and
   b) for each of the pixels always one of the subpixels is sensitive so that apart from deletion of collected signal charge carriers, the pixels are free from dead time.

3. The detector arrangement according to claim 1, wherein the DEPFETs can each be switched between
   a) a read mode in which the signal charge carriers collected in the internal gate of the DEPFET to be read, generate an output signal which indicates the measured radiation, and
   b) a non-read mode in which no signal is read.

4. The detector arrangement according to claim 1, further comprising shielding electrodes for shielding the internal gate of the DEPFET in the insensitive-switched subpixel, so that the radiation-generated signal charge carriers substantially do not reach the internal gate of the DEPFET in the insensitive-switched subpixel.

5. The detector arrangement according to claim 4, wherein the DEPFETs of the subpixels have a common source and drains of the DEPFETs form the shielding electrodes.

6. The detector arrangement according to claim 4, wherein the DEPFETs of the subpixels have a common drain and sources of the DEPFETs form the shielding electrodes.

7. The detector arrangement according to claim 4, wherein the shielding electrodes are separate from drains and sources of the DEPFETs and can be controlled separately.

8. The detector arrangement according to claim 1, wherein
   a) different pixels of the semi-conductor detector each have at least one shielding electrode for each of the subpixels, for shielding of the internal gate of the insensitive DEPFETs, and
   b) shielding electrodes of several pixels are connected together electrically.

9. The detector arrangement according to claim 1, wherein
   a) the external gate of the sensitive DEPFET is controlled differently from the external gate of the insensitive DEPFET, and
   b) the differing control of the external gates of the DEPFETs in the semi-conductor detector contributes to a potential field which conducts the radiation-generated signal charge carriers substantially only into the internal gate of the sensitive DEPFET and shields the internal gate of the insensitive DEPFET.

10. The detector arrangement according to claim 4, wherein
    a) the radiation-generated signal charge carriers reach the internal gate of the sensitive-switched DEPFET with a selectivity such that they are more than 1000 times more numerous than those reaching the internal gate of the insensitive-switched DEPFET, and
    b) the detector arrangement for a pixel takes up a certain total pixel surface area of a semi-conductor substrate, wherein the shielding electrodes take up a surface area proportion of at least 10% of the total pixel surface area, in order to achieve a high selectivity of their shielding effect, and c) a lateral distance between the internal gates of the DEPFETs is substantially smaller than a lateral extension of the shielding electrodes, in order to achieve a high selectivity of their shielding effect.

11. The detector arrangement according to claim 1, wherein
 a) each of the pixels has at least four subpixels which are sequentially switched sensitive and are otherwise insensitive, and
 b) each of the subpixels has a DEPFET, and
 c) the subpixels are arranged on a common substrate and separated from each other by a separator.

12. The detector arrangement according to claim 1, wherein
 a) the detector arrangement has a control unit which is electrically connected to the DEPFETs, and
 b) the control unit switches between the first collection state and the second collection state, and
 c) the control unit controls the shielding electrodes electrically in order to switch between the first collection state and the second collection state, and
 d) the control unit switches the DEPFETs between read mode and non-read mode, and
 e) the control unit controls the source or drain and external gate of the DEPFETs to switch between read mode and non-read mode.

13. The detector arrangement according to claim 1, wherein
 a) all DEPFETs of the detector arrangement which are in the first collection state are switched simultaneously to the second collection state, and
 b) all DEPFETs of the detector arrangement which are in the second collection state are switched simultaneously to the first collection state, and
 c) the pixels contain a drift structure which allows the radiation-generated signal charge carriers to drift to the DEPFETs, and
 d) always at least one of the DEPFETs is sensitive, and
 e) the DEPFETs have a dead time in all cases on deletion of the collector signal carriers and are otherwise free from dead time.

14. The detector arrangement according to claim 1, wherein
 a) the pixels are arranged as a matrix in lines and columns, and
 b) all pixels of the matrix or the pixels of individual lines or individual columns are switched between the first and second collection states together, and
 c) the pixels of the individual lines or individual columns are switched between read mode and non-read mode together.

15. An operating method for a detector arrangement with semi-conductor detector with several pixels, each of which has at least two subpixels, comprising the following method steps:
 a) setting of a first collection state of the semi-conductor detector in which the first subpixel is sensitive while the second subpixel is insensitive,
 b) collection of radiation-generated signal charge carriers in the sensitive first subpixel,
 c) setting of a second collection state of the semi-conductor detector in which the second subpixel is sensitive while the first subpixel is insensitive, and
 d) collection of radiation-generated signal charge carriers in the sensitive second subpixel,
wherein
 e) at least four DEPFETs are switched sequentially sensitive or insensitive
 f) in each case one of the DEPFETs is switched sensitive while another DEPFET is switched insensitive,
 g) in the individual DEPFETs, the sensitive state is set for a duration of less than 1 ms, 100 µs or 10 µs, and
 h) switching between the individual measurement states takes place more frequently than reading.

16. The operating method according to claim 15, further comprising the following method steps:
 a) reading of collected radiation-generated signal charge carriers from the first subpixel in a read mode, and
 b) reading of the collected radiation-generated signal charge carriers from the second subpixel in a read mode.

17. The operating method according to claim 16, wherein the read mode of the first subpixel takes place during the second collection state in which the first subpixel is insensitive, while the read mode of the second subpixel takes place during the first collection state in which the second subpixel is insensitive.

18. The operating method according to claim 16, wherein the read mode of the first subpixel takes place during the first collection state in which the first subpixel is sensitive, while the read mode of the second subpixel takes place during the second collection state in which the second subpixel is sensitive.

19. The operating method according to claim 15, further comprising the following steps:
 a) setting of the first collection state of the semi-conductor detector in which only the first subpixel is sensitive while the other subpixels are insensitive,
 b) collection of radiation-generated signal charge carriers in the sensitive first subpixel,
 c) setting of a second collection state of the semi-conductor detector in which only the second subpixel is sensitive while the other subpixels are insensitive,
 d) collection of radiation-generated signal charge carriers in the sensitive second subpixel,
 e) setting of a third collection state of the semi-conductor detector in which only a third subpixel is sensitive while the other subpixels are insensitive,
 f) collection of radiation-generated signal charge carriers in the sensitive third subpixel,
 g) setting of a fourth collection state of the semi-conductor detector in which only a fourth subpixel is sensitive while the other subpixels are insensitive, and
 h) collection of radiation-generated signal charge carriers in the sensitive fourth subpixel.

20. The operating method according to claim 19, wherein a read mode of the individual subpixels takes place in the insensitive state.

21. The operating method according to claim 19, wherein a read mode of the individual subpixels takes place in the sensitive state.

* * * * *